US011119676B2

(12) United States Patent
Thangaraj et al.

(10) Patent No.: US 11,119,676 B2
(45) Date of Patent: Sep. 14, 2021

(54) USING SPARE BITS IN MEMORY SYSTEMS

(71) Applicant: International Business Machines Corporation, Armonk, NY (US)

(72) Inventors: Krishna Thangaraj, Poughkeepsie, NY (US); David D. Cadigan, Danbury, CT (US); Kevin M. Mcilvain, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/677,740

(22) Filed: Nov. 8, 2019

(65) Prior Publication Data

US 2021/0141550 A1 May 13, 2021

(51) Int. Cl.
*G06F 3/06* (2006.01)
*G11C 14/00* (2006.01)

(52) U.S. Cl.
CPC .......... *G06F 3/0635* (2013.01); *G06F 3/0604* (2013.01); *G06F 3/068* (2013.01); *G11C 14/0036* (2013.01)

(58) Field of Classification Search
CPC ...... G06F 3/0635; G06F 3/0604; G06F 3/068; G11C 14/0036
See application file for complete search history.

(56) References Cited

U.S. PATENT DOCUMENTS

| 8,671,243 | B2 | 3/2014 | Chen et al. | |
|---|---|---|---|---|
| 8,756,474 | B2 | 6/2014 | Shibata et al. | |
| 8,832,406 | B2 | 9/2014 | Prahlad et al. | |
| 9,269,437 | B2 | 2/2016 | Chen et al. | |
| 9,342,423 | B2 | 5/2016 | Judd | |
| 9,715,424 | B1 | 7/2017 | Ware et al. | |
| 9,887,008 | B2 | 2/2018 | Lee et al. | |
| 10,216,637 | B2 | 2/2019 | Ergan et al. | |
| 10,261,702 | B2 | 4/2019 | Rousseau | |
| 2012/0271990 | A1 | 10/2012 | Chen et al. | |
| 2012/0287727 | A1* | 11/2012 | Wang | G11C 11/40618 365/189.05 |
| 2013/0124778 | A1 | 5/2013 | Arya et al. | |
| 2014/0215277 | A1 | 7/2014 | Judd | |
| 2015/0248248 | A1* | 9/2015 | Trezise | G11B 23/049 711/103 |
| 2016/0112407 | A1* | 4/2016 | Nara | G06F 11/1464 726/5 |
| 2016/0321338 | A1* | 11/2016 | Isherwood | H04L 67/1097 |
| 2016/0342487 | A1* | 11/2016 | Ware | G06F 3/0619 |

(Continued)

FOREIGN PATENT DOCUMENTS

DE 102013105049 A1 11/2013

*Primary Examiner* — Michelle T Bechtold
(74) *Attorney, Agent, or Firm* — Daniel M. Yeates (57) ABSTRACT

Disclosed is a computer implemented method to mark data as persistent using spare bits. The method includes receiving, by a memory system, a set of data, wherein the set of data includes a subset of meta-bits, and the set of data is received as a plurality of transfers, and wherein the memory system includes a first rank and a second rank. The method also includes decoding, by a decoder, the subset of meta-bits, wherein the subset of meta-bits are configured to indicate the set of data is important. The method further includes storing, based on the decoding, the set of data in a persistent storage medium.

17 Claims, 6 Drawing Sheets

(56) References Cited

U.S. PATENT DOCUMENTS

| | | |
|---|---|---|
| 2017/0212680 A1 | 7/2017 | Waghulde |
| 2018/0165159 A1* | 6/2018 | Baker ................. G06F 11/1448 |
| 2019/0171520 A1 | 6/2019 | Cadigan et al. |
| 2019/0243771 A1* | 8/2019 | Mittal .................... G06N 5/022 |
| 2020/0143857 A1* | 5/2020 | Nakamura ............... G11C 7/10 |

* cited by examiner

(1/2) Burst size = Burst length X xfr size =
8 X (5 device X 8b)
    = 8 X 40b
    = 8 X (32b data + 7b ECC + 1 MBit)
    = 256b data + 56b ECC + 8Mbit Now for the 5 devices (5 X 8 = 40b)
Xfr0 (40b) = 5 X (7b data + 1b Mbit)
           = 32b data + 5b Mbit + 3b Parity Xfr1 (40b) = (4 X 8b data) + (1X 8b ECC)
Xfr2 (40b) = (4 X 8b data) + (1X 8b ECC)
Xfr3 (40b) = (4 X 8b data) + (1X 8b ECC)
Xfr4 (40b) = (4 X 8b data) + (1X 8b ECC)
Xfr5 (40b) = (4 X 8b data) + (1X 8b ECC)
Xfr6 (40b) = (4 X 8b data) + (1X 8b ECC)
Xfr7 (40b) = (4 X 8b data) + (1X 8b ECC)

Total = 256b data + 56b ECC + 5b Mbit + 3b
Parity

The Mbit from Xfr0 is decoded to decide mirroring of data in port 1 for persistent storage

420

(2/2) Burst size = Burst length X xfr size =
8 X (5 device X 8b)
    = 8 X 40b
    = 8 X (32b data + 7b ECC + 1 MBit)
    = 256b data + 56b ECC + 8Mbit Now for the 5 devices (5 X 8 = 40b)
Xfr0 (40b) = 5 X (7b data + 1b Mbit)
           = 32b data + 5b Mbit + 3b Parity Xfr1 (40b) = (4 X 8b data) + (1X 8b ECC)
Xfr2 (40b) = (4 X 8b data) + (1X 8b ECC)
Xfr3 (40b) = (4 X 8b data) + (1X 8b ECC)
Xfr4 (40b) = (4 X 8b data) + (1X 8b ECC)
Xfr5 (40b) = (4 X 8b data) + (1X 8b ECC)
Xfr6 (40b) = (4 X 8b data) + (1X 8b ECC)
Xfr7 (40b) = (4 X 8b data) + (1X 8b ECC)

Total = 256b data + 56b ECC + 5b Mbit + 3b
Parity

The Mbit from Xfr0 is decoded to decide mirroring of data in port 2 for persistent storage

FIG. 4

(1/2) Burst size                = Burst length X xfr size   =
16 X (5 device X 8b)
                = 16 X 40b
                = 16 X (32b data + 7B ECC + 1 MBit)
                = 512b data + 112b ECC + 16b Mbit Now for the 5 devices (5 X 8 = 40b)
Xfr0   (40b)   = 5 X (7b data + 1b Mbit)
                = 32b data + 5b Mbit + 3b (Mode info | inversion bit | data bus inversion)

Xfr1   (40b)   = (4 X 8b data) + (1X 8b ECC)
Xfr2   (40b)   = (4 X 8b data) + (1X 8b ECC)
Xfr3   (40b)   = (4 X 8b data) + (1X 8b ECC)
Xfr4   (40b)   = (4 X 8b data) + (1X 8b ECC)
Xfr5   (40b)   = (4 X 8b data) + (1X 8b ECC)
Xfr6   (40b)   = (4 X 8b data) + (1X 8b ECC)
Xfr7   (40b)   = (4 X 8b data) + (1X 8b ECC)
Xfr8   (40b)   = (4 X 8b data) + (1X 8b ECC)
Xfr9   (40b)   = (4 X 8b data) + (1X 8b ECC)
Xfr10  (40b)   = (4 X 8b data) + (1X 8b ECC)
Xfr11  (40b)   = (4 X 8b data) + (1X 8b ECC)
Xfr12  (40b)   = (4 X 8b data) + (1X 8b ECC)
Xfr13  (40b)   = (4 X 8b data) + (1X 8b ECC)
Xfr14  (40b)   = (4 X 8b data) + (1X 8b ECC)
Xfr15  (40b)   = (4 X 8b data) + (1X 8b ECC) -> ECC for Mb End up with 3 spare bits from Xfr0, Xfr15 gives ECC for Mbits Total           = 512b data + 112b ECC + 5b Mbit + 8b ECC for Mb + 3b
The Mbit from Xfr0 is decoded to decide mirroring of data in port 1 for persistent storage

510

(2/2) Burst size                = Burst length X xfr size   =
16 X (5 device X 8b)
                = 16 X 40b
                = 16 X (32b data + 7B ECC + 1 MBit)
                = 512b data + 112b ECC + 16b Mbit Now for the 5 devices (5 X 8 = 40b)
Xfr0   (40b)   = 5 X (7b data + 1b Mbit)
                = 32b data + 5b Mbit + 3b (Mode info | inversion bit | data bus inversion)

Xfr1   (40b)   = (4 X 8b data) + (1X 8b ECC)
Xfr2   (40b)   = (4 X 8b data) + (1X 8b ECC)
Xfr3   (40b)   = (4 X 8b data) + (1X 8b ECC)
Xfr4   (40b)   = (4 X 8b data) + (1X 8b ECC)
Xfr5   (40b)   = (4 X 8b data) + (1X 8b ECC)
Xfr6   (40b)   = (4 X 8b data) + (1X 8b ECC)
Xfr7   (40b)   = (4 X 8b data) + (1X 8b ECC)
Xfr8   (40b)   = (4 X 8b data) + (1X 8b ECC)
Xfr9   (40b)   = (4 X 8b data) + (1X 8b ECC)
Xfr10  (40b)   = (4 X 8b data) + (1X 8b ECC)
Xfr11  (40b)   = (4 X 8b data) + (1X 8b ECC)
Xfr12  (40b)   = (4 X 8b data) + (1X 8b ECC)
Xfr13  (40b)   = (4 X 8b data) + (1X 8b ECC)
Xfr14  (40b)   = (4 X 8b data) + (1X 8b ECC)
Xfr15  (40b)   = (4 X 8b data) + (1X 8b ECC) -> ECC for Mb End up with 3 spare bits from Xfr0, Xfr15 gives ECC for Mbits Total           = 512b data + 112b ECC + 5b Mbit + 8b ECC for Mb + 3b
The Mbit from Xfr0 is decoded to decide mirroring of data in port 2 for persistent storage

USING SPARE BITS IN MEMORY SYSTEMS

BACKGROUND

The present disclosure relates to memory systems, and, more specifically, to utilizing spare bits to classify data as persistent.

Modern computing systems utilize several types or random access memory (RAM). RAM provides storage for data that is close to the core and increases overall computing performance by reducing lag time. Traditionally, RAM is volatile, meaning it is not retained on a loss of power. In high performance computing applications, it has become increasingly important to prevent the loss of this data.

SUMMARY

Disclosed is a computer implemented method to mark data as persistent using spare bits. The method includes receiving, by a memory system, a set of data, wherein the set of data includes a subset of meta-bits, and the set of data is received as a plurality of transfers, and wherein the memory system includes a first rank and a second rank. The method also includes decoding, by a decoder, the subset of meta-bits, wherein the subset of meta-bits are configured to indicate the set of data is important. The method further includes storing, based on the decoding, the set of data in a persistent storage medium. Further aspects of the present disclosure are directed to systems and computer program products containing functionality consistent with the method described above.

The present Summary is not intended to illustrate each aspect of, every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of present disclosure relates to memory systems, and, more specifically, to utilizing spare bits to classify data as persistent. Aspects of the present disclosure may be better appreciated in light of the aforementioned applications.

Double data rate (DDR) memory is an advanced version of synchronous dynamic random access memory (SDRAM) and is a common memory system used in several modern computing applications. DDR uses both the falling and rising edge of a clock signal to transfer data.

DDR chips can be deployed as part of dual in-line memory modules (DIMM). A DIMM chip (DIMM card) can be a circuit board with one or more DDR (or other RAM) chips configured to interact with one or more processors. In some embodiments, DIMM are operatively connected to the motherboard of a computing system. In some embodiments, DIMM include multiple ranks of RAM, where the ranks are different or the same type of RAM. For example, a first rank may be a volatile storage, and a second rank a persistent storage.

Dynamic random-access memory (DRAM) is a type of memory cell consisting of a capacitor and a transistor. The capacitor can be charged or discharged, each of these states corresponds to a bit of data. However, DRAM is volatile. If an error occurs, and/or if power is lost, data stored is DRAM is lost. There are several methods to prevent the loss of DRAM data.

In some embodiments, a backup power supply (e.g., integrated battery) is used to prevent the loss of data. This increases the cost of manufacture and maintenance. In some embodiments, loss of data is prevented by replacing DRAM with a persistent memory. These embodiments have their own drawbacks. They may require specialized hardware modification for non-standard connections. They may have a higher manufacturing cost due to additional components and/or circuits. They may also have a higher thermal footprint corresponding to higher power consumption. Embodiments of the present disclosure overcome some of the above issues by using a non-volatile portion (or rank)a persistent memory in the memory system.

Embodiments of the present disclosure prevent the loss of important data resulting from a power loss or other error. Embodiments of the present disclosure eliminate the need for additional circuity and/or backup power as well the need for additional controller or NAND backup.

Embodiments of the present disclosure include a system and/or method to use spare bits on the DDR interface to classify data as persistent (or important).

In some embodiments, each transfer of a burst has data bits and a spare bit. In some embodiments, the data bit can be mapped to a meta-bit and the spare-bit can be re-mapped to be used as a data bit.

In some embodiments, if the data is designated as important, it can be stored in a non-volatile portion (or rank) of a DIMM. In some embodiments, the memory system includes a decoder. The decoder may determine, based on the value of the meta-bits, if the data is important. Then then the data can be backed up on a persistent rank of memory within the DIMM. The second rank may include any persistent data storage, such as magnetoresistive random access memory (MRAM), or ferroelectric random access memory (Fe-RAM).

In some embodiments, an application and/or an operating system designate data as important. The data is marked important by encoding the meta-bits. As the data is sent to the DIMM for storage, a storage decoder can read the meta-bits and determine if the data should be sent to a non-persistent data bank, a persistent data bank, or both. Storing certain data on a persistent medium will prevent the loss of that data upon loss of power. It also eliminates the need for a backup power supply and the circuitry to support it.

In some embodiments, DDR5 memory systems are used. DDR5 is a version (or generation, or specification) of DDR. DDR5 may have a higher data throughput while using less power than other versions of DDR (e.g., DDR4, DDR3, etc.).

The aforementioned advantages are example advantages, and embodiments exist that can contain all, some, or none of the aforementioned advantages while remaining within the spirit and scope of the present disclosure.

Figure 1:
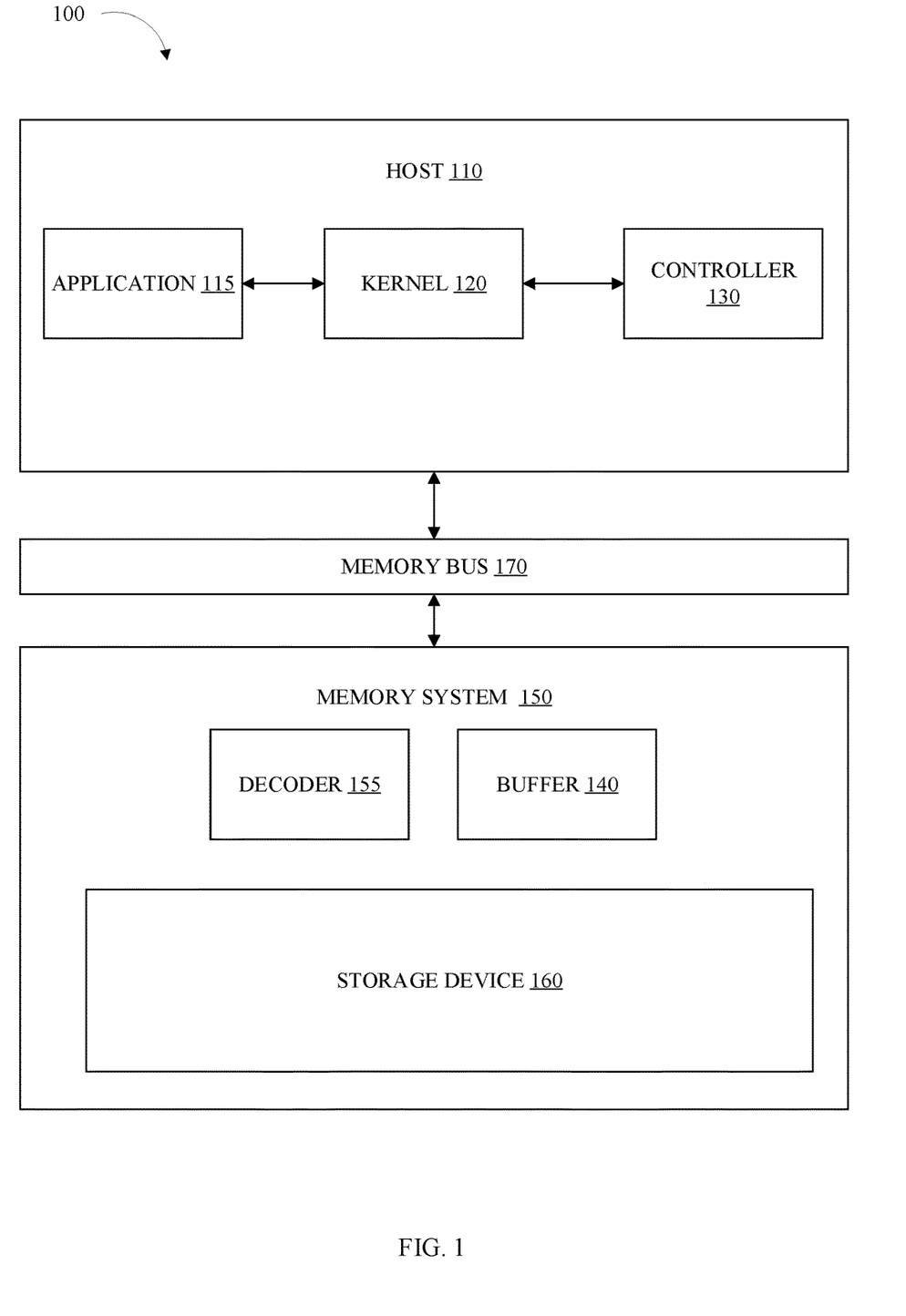
FIG. 1 is a block diagram of a computing environment suitable for operation of memory system, in accordance with some embodiments of the present disclosure.

Referring now to various embodiments of the disclosure in more detail, FIG. 1 is a representation of a computing environment 100, that is capable of using spare bits to backup important memory. Many modifications to the depicted environment may be made by those skilled in the art without departing from the scope of the disclosure as recited by the claims.

Computing environment 100 includes host 110, memory system 150, and memory bus 170. Host 110 can be a standalone computing device, a management server, a web server, a mobile computing device, or any other electronic device or computing system capable of receiving, sending, and processing data. In other embodiments, host 110 can represent a server computing system utilizing multiple computers as a server system, such as in a cloud computing environment. In some embodiments, host 110 represents a computing system utilizing clustered computers and components (e.g., database server computers, application server computers, etc.) that act as a single pool of seamless resources when accessed within computing environment 100. In some embodiments host 110 includes application 115, kernel 120, controller 130, and buffer 140.

Application 115 can be any combination of hardware and/or software configured to carry out a function on a computing device (e.g., host 110). In some embodiments, application 115 is a set of instructions configured to perform one or more tasks. In some embodiments, application 115 sends the instructions to kernel 115. The instructions may include where certain data is stored, where to store data, and/or how to process the data. For example, the instruction may include read commands, write commands, and/or similar commands. In some embodiments, the instructions are carried by one or more processors. In some embodiments, application 115 is a software program (e.g., accounting software, system backup software, word processor, etc.).

In some embodiments, application 115 marks data as important. Important data is data that should be duplicated, backed up, and/or stored in a persistent state (e.g., MRAM). In some embodiments, the data is marked important with meta-bits of data. The meta-bits can be encoded to indicate of none, some, or all of data should be stored in persistent data. In some embodiments, application 115 will indicate when data is no longer important. For example, several sequential commands (or data transfers) may all be important. The application can mark the first transfer as important.

Once the important instructions have been sent, it may then mark the next transfer as standard (or not important).

Kernel 120 can be any combination of hardware and software capable of managing the workload of host 110 and provide access to low-level operating components of the host 110. In some embodiments, kernel 120 receives instructions from one or more applications (e.g., application 115) requesting resources of host 110. In these embodiments, kernel 120 prioritizes and executes the system calls based on one or more algorithms. In some embodiments, kernel 120 is part of the operating system of host 110. Kernel 120 can be communicatively coupled to the other components of host 110. In some embodiments, kernel 120 can mark data as important with the same manner and methods as application 115.

Controller 130 (or data controller) can be any combination of hardware and/or software configured to manage the flow of data with a memory system. In some embodiments, controller 130 reads memory from and writes memory too the memory system.

Memory system 150 can be any combination of hardware and/or software configured to store data for use by host 110. In some embodiments, memory system 150 acts as RAM for host 110. In some embodiments, memory system 150 includes one or more of MRAM, DRAM, SDRAM, single data rate SDRAM, and/or flash memory. In some embodiments, memory system 150 is configured to support DDR5. In some embodiments, memory system 150 includes buffer 140, decoder 155, and storage array 160.

Buffer 140 can be any combination of hardware and/or software configured to rout and load memory into storage array 160. In some embodiments, buffer 140 includes a register clock driver (RCD). In some embodiments, buffer 140 is connected to a command address bus.

Decoder 155 can be any combination of hardware and/or software configured to perform an action based on the meta-bits in a data transfer. In some embodiments, the decoder can include one or more standalone hardware components. The hardware components may be located in the persistent memory, in the DRAM, in the FPGA, a component of the buffer 140 and/or a combination of some or all the above. In some embodiments, the action is to store (or backup) the data in a persistent storage medium (e.g., MRAM).

Storage device 160 can be any combination of hardware and/or software configured to store data. In some embodiments, storage array 160 is a multi-ranked storage system. Storage array 160 will be discussed in further detail in FIG. 2.

Memory bus 170 can be any combination of hardware and/or software configured to transfer data between host 110 and memory system 150. In some embodiments, memory bus includes a data bus and a command bus. Both the command bus (or command address bus) and the memory bus may communicatively connect host 110 to memory system 150. In some embodiments, memory system 150 and/or memory bus 170 are included in host 110.

Figure 2:
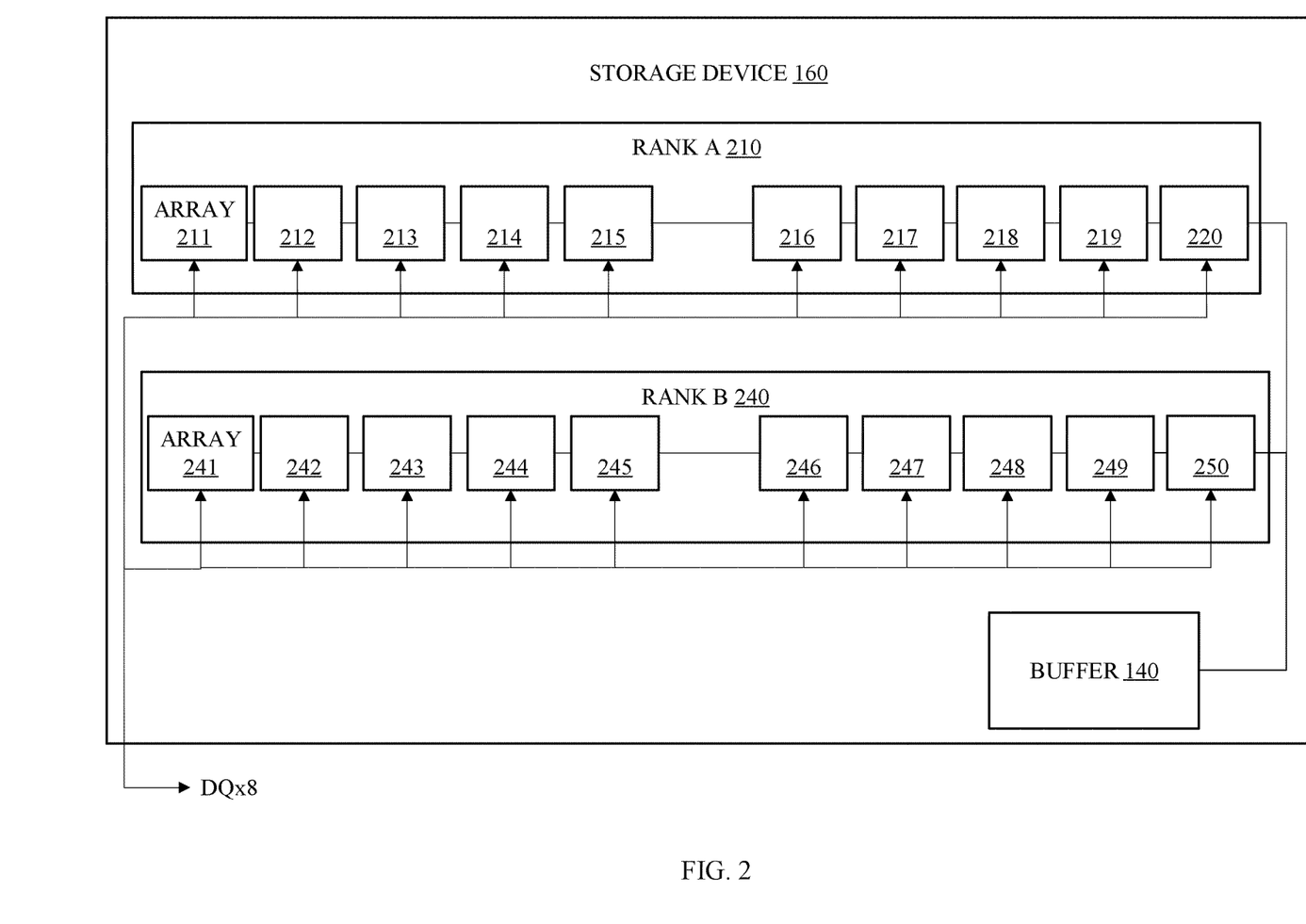
FIG. 2 illustrates a functional diagram of a multi-rank memory device, in accordance with some embodiments of the present disclosure.

FIG. 2 is an expanded view of storage array 160, with bus connections to buffer 140 and decoder 155. In some embodiments, storage array 160 includes rank A 210 and rank B 240. In some embodiments, storage array 160 includes more than two ranks of storage. In some embodiments, at least one rank of storage includes persistent storage.

Rank A 210 can be any DIMM storage device. In some embodiments, rank A 210 includes arrays 211, 212, 213, 214, 215, 216, 217, 218, 219, and 220. In various embodiments, each rank may include a different number of storage arrays. Each array is connected to buffer 140 via the command address bus. In some embodiments, rank A 210 may be DDR5, and/or DDR4 memory module.

In some embodiments, each array has a device width of ×8 (DQ×8). The width represents the amount of data that can be sent to an array in a single transfer. Various embodiments may have different widths (e.g., ×4, ×8, ×16, etc.). In some embodiments, rank A 210 includes two or more ports. For example, arrays 211-215 may be linked to port 1, and arrays 216 to 220 to port 2. In some embodiments, one or more array is used to store an error correction code (ECC). An ECC can be used to detect and correct data errors that occur while data is stored in the memory system 150. The error may be caused by a capacitor losing charge, a soft fault, and other similar errors.

In various embodiments, rank A 210 includes any type of data storage that may be used as RAM. In some embodiments, rank A 210 includes volatile memory. Rank A 210 may include DRAM, SRAM, MRAM, Fe-RAM and/or other similar storage technologies.

Rank B 240 can be any DIMM storage device. In some embodiments, rank B 240 is consistent with rank A 210 except it includes arrays 241-250. In some embodiments, rank B 240 includes persistent storage arrays while rank A 210 include volatile storage arrays. In some embodiments, rank B 240 has a smaller storage capacity than rank A 210, or said different, rank A 210 has a larger (higher) capacity than rank B 240. In various embodiments, the persistent storage may include one or more of magnetic RAM (MRAM), ferroelectric RAM (FRAM), resistive RAM (Re-RAM), phase change memory (PCM), 3D X-Point memory (3DXP), and any other known or future developed persistent memory. The memory may be configured to function in a DDR system.

In some embodiments, storage device 160 includes an unregistered DIMM (or unbuffered DIMM). The unregistered DIMM may not include a buffer. The data will go directly from the controller to storage device 160.

Figure 3:
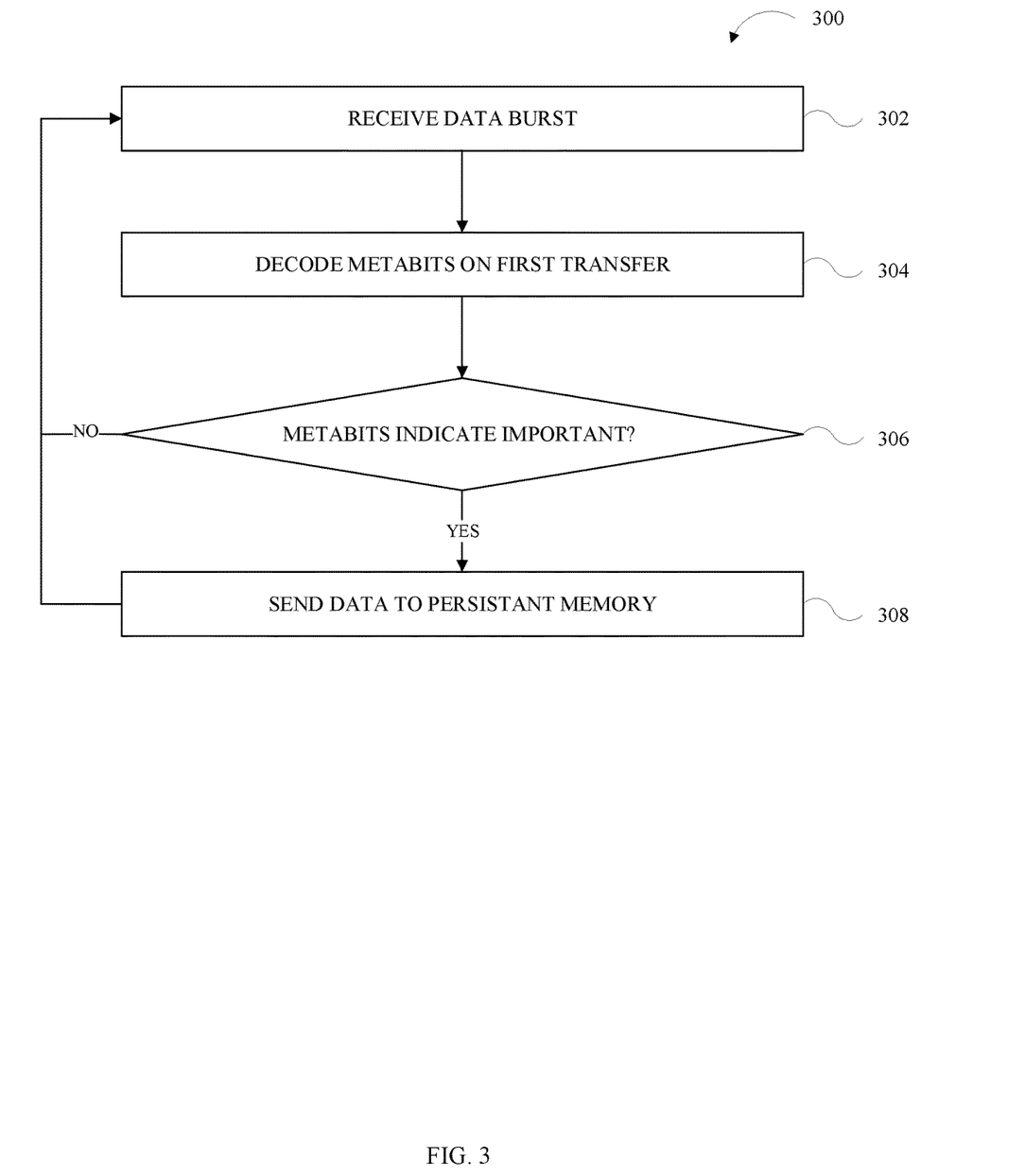
FIG. 3 illustrates a flow chart of an example method to store data in a persistent medium based on spare or meta-bits, in accordance with some embodiments of the present disclosure.

FIG. 3 is a flowchart of a method 300 for using spare bits to backup data in a memory system that can be performed in a computing environment (e.g., computing environment 100 and/or host 110). One or more of the advantages and improvements described above can be realized by the method 300, consistent with various embodiments of the present disclosure.

Method 300 can include more or fewer operations than those depicted. Method 300 can include operations in different orders than the order depicted. Likewise, the method 300 can include operations that occur simultaneously rather than sequentially. Many modifications to the depicted method may be made by those skilled in the art without departing from the spirit and scope of the present disclosure. Method 300 can be implemented by one or more processors, a computing device (e.g., host 110 of FIG. 1), or a different combination of hardware and/or software. In various embodiments, the various operations of method 300 are performed by one or more of, or the components within, host 110, memory system 150.

At operation 302, memory system 150 receives a data burst. In some embodiments, the data is received from host 110. In some embodiments, the data burst includes a plurality of transfers (Xfr1). During each transfer, a specified number of bits is sent to each array (e.g., array 211). The number of bits is correlated to the width of the data bust (DQ bus). In some embodiments, the transfer is divided into ports. For example, the part of the transfer is sent through port 1 and another part through port 2.

In some embodiments, the data burst includes a set of data. The set of data may be all of the data of the burst. In some embodiments, the set of data may be divided into one or more subsets. For example, one subset of the set of data may include meta-bits, another ECC bits, etc.

In some embodiments, the data transfer is configured to include meta-bits. The meta-bits may indicate if the data in this and subsequent transfers should be sent to a persistent storage medium. In some embodiments, host 110, application 115, and/or kernel 120 encode the meta-bits.

Figure 4:
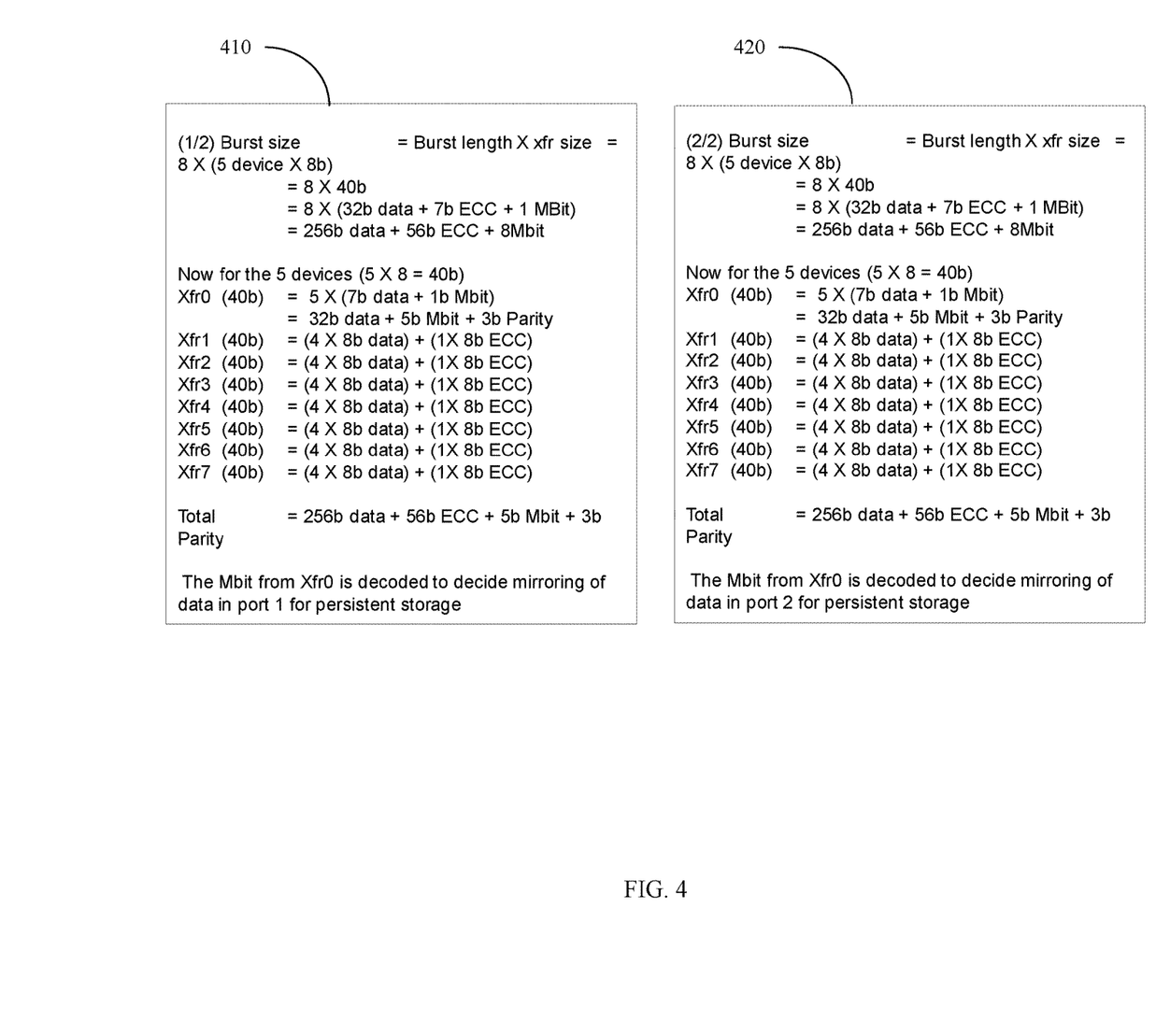
FIG. 4 illustrates the data allocation for a data burst of eight transfers, in accordance with some embodiments of the present disclosure.
Figure 5:
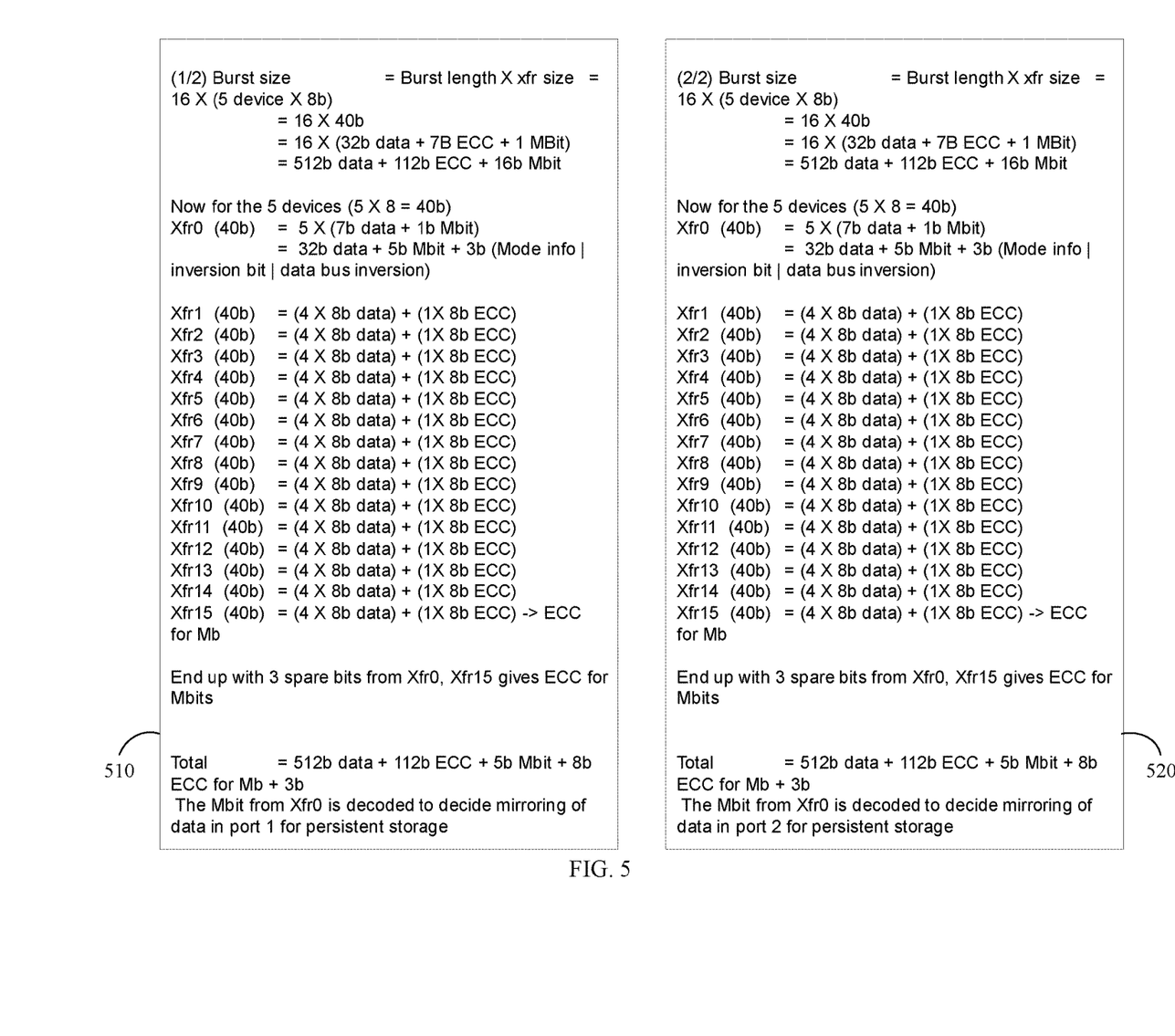
FIG. 5 illustrates the data allocation for a data burst of sixteen transfers, in accordance with some embodiments of the present disclosure.

FIG. 4 and FIG. 5 show example breakdowns of bits for different sizes of data transfers. FIG. 4 shows one embodiment of an eight-burst data transfer: bit breakdown 410 shows the data sent through port 1, and bit breakdown 420 the data sent through port 2. In some embodiments, port 1 corresponds to half of the arrays in a rank (e.g., arrays 211-215 of rank A 210). In each port, total burst size is the number of transfers times the width times the number of arrays. Assuming 5 arrays, and a width of 8, that is a total of 320 bits. In some embodiments, those bits are divided up such that there are 256 b of data, 56 b of ECC, and 8 b of meta-bits. The total may be distributed during any transfer. Each transfer will send 40 b (5 devices times a width of 8) per transfer. In some embodiments, transfer 0 includes 7 b data and 1 b meta-bit per array with three additional bits, and transfers 1-7 with 8 b data to 4 arrays, and 8 b ECC to 1 array. That totals 256 b of data, 56 b ECC, 5 b meta-bits, and 3 b of additional data. Port 2 can be consistent with port 1.

FIG. 5 shows one embodiment of a sixteen-burst data transfer. 510 shows the data sent through port 1, and 520 the data sent through port 2. In some embodiments, port 1 corresponds to half of the arrays in a rank (e.g., arrays 211-215 of rank A 210). In each port, total burst size is the number of transfers times the width times the number of arrays. Assuming 5 arrays, and a width of 8, that is a total of 640 bits. In some embodiments, those bits are divided up such that there are 512 b of data, 112 b of ECC, and 16 b of meta-bits. The total may be distributed during any transfer. Each transfer will send 40 b (5 devices times a width of 8) per transfer. In some embodiments, transfer 0 includes 7 b data and 1 b meta-bit per array with three additional bits, and transfers 1-7 with 8 b data to 4 arrays, and 8 b ECC to 1 array. That totals 512 b of data, 112 b ECC, 5 b meta-bits, and 11 b of additional data. In some embodiments, the 11 b of additional data can be allocated such that 8 b are used as meta-bit ECC, leaving 3 b remaining.

At operation 304, memory system 150 decodes the meta-bits. In some embodiments, the meta-bits are decoded by decoder 155. At operation 306, memory system 150 determines if the meta-bits indicate the data is important. In some embodiments, the determination is made based on the operation 304. If it is determined the meta-bits indicate the data is important (306:YES), then memory system 150 proceeds to operation 308. If it is determined the meta-bits indicate the data is not important (306:NO), then memory system 150 returns to operation 302.

In some embodiments, the data is determined to be important until the meta-bits of a subsequent burst indicate the data is not important. For example, a first burst may be determined important. Any subsequent burst may still be important until new meta-bits indicate the next burst in not important. In some embodiments, a portion of the transfers of a burst may be determined to be important. For example, the meta-bits may indicate that transfers 0-3 are important and transfers 4-7 are not.

At operation 308, storage system 150 sends the data to persistent storage. In some embodiments, the data is sent to both volatile and persistent storage (e.g., rank A 210 and rank B 240). The data sent to the persistent rank may be a backup of the data sent to the volatile memory. If there is a power loss or other error, the important data may be more quickly retrieved to restore the system to the state prior to the error. In some embodiments, storage system 150 returns to operation 302 in response to completing operation 308.

Figure 6:
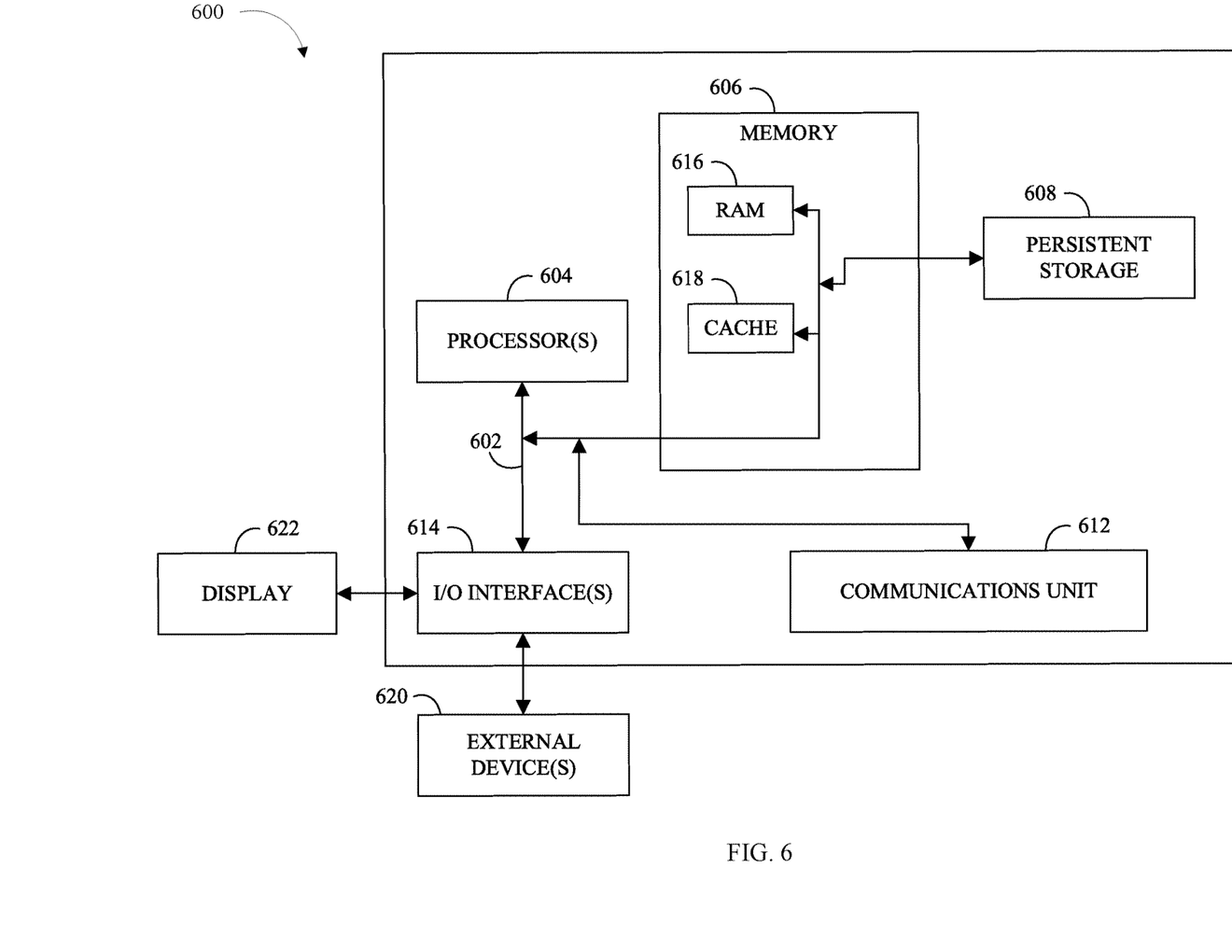
FIG. 6 illustrates a block diagram of an example computer system operating the storage system, in accordance with some embodiments of the present disclosure.

FIG. 6 is a block diagram depicting components of a computer 600 suitable for storing data in persistent memory based on spare bits in a data transfer, in accordance with at least one embodiment of the invention. In an embodiment, computer 600 is representative of host 110 and/or storage system 150. FIG. 6 displays the computer 600, one or more processor(s) 604 (including one or more computer processors), a communications fabric 602, a memory 606 including, a RAM 616, and a cache 618, a persistent storage 608, a communications unit 612, I/O interfaces 614, a display 622, and external devices 620. It should be appreciated that FIG. 6 provides only an illustration of one embodiment and does not imply any limitations with regard to the environments in which different embodiments may be implemented. Many modifications to the depicted environment may be made.

As depicted, the computer 600 operates over the communications fabric 602, which provides communications between the computer processor(s) 604, memory 606, persistent storage 608, communications unit 612, and input/output (I/O) interface(s) 614. The communications fabric 602 may be implemented with any architecture suitable for passing data or control information between the processors 604 (e.g., microprocessors, communications processors, and network processors), the memory 606, the external devices 620, and any other hardware components within a system. For example, the communications fabric 602 may be implemented with one or more buses.

The memory 606 and persistent storage 608 are computer readable storage media. In the depicted embodiment, the memory 606 comprises a random access memory (RAM) 616 and a cache 618. In general, the memory 606 may comprise any suitable volatile or non-volatile one or more computer readable storage media.

Program instructions for customized host 110 and/or memory system 150 may be stored in the persistent storage 608, or more generally, any computer readable storage media, for execution by one or more of the respective computer processors 604 via one or more memories of the memory 606. The persistent storage 608 may be a magnetic hard disk drive, a solid state disk drive, a semiconductor storage device, read-only memory (ROM), electronically erasable programmable read-only memory (EEPROM), flash memory, or any other computer readable storage media that is capable of storing program instructions or digital information.

The media used by the persistent storage 608 may also be removable. For example, a removable hard drive may be used for persistent storage 608. Other examples include optical and magnetic disks, thumb drives, and smart cards that are inserted into a drive for transfer onto another computer readable storage medium that is also part of the persistent storage 608.

The communications unit 612, in these examples, provides for communications with other data processing systems or devices. In these examples, the communications unit 612 may comprise one or more network interface cards. The communications unit 612 may provide communications through the use of either or both physical and wireless communications links. In the context of some embodiments of the present invention, the source of the various input data may be physically remote to the computer 600 such that the input data may be received and the output similarly transmitted via the communications unit 612.

The I/O interface(s) 614 allow for input and output of data with other devices that may operate in conjunction with the computer 600. For example, the I/O interface 614 may provide a connection to the external devices 620, which may be as a keyboard, keypad, a touch screen, or other suitable input devices. External devices 620 may also include portable computer readable storage media, for example thumb drives, portable optical or magnetic disks, and memory cards. Software and data used to practice embodiments of the present invention may be stored on such portable computer readable storage media and may be loaded onto the persistent storage 608 via the I/O interface(s) 614. The I/O interface(s) 614 may similarly connect to a display 622. The display 622 provides a mechanism to display data to a user and may be, for example, a computer monitor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
receiving, by a memory system, a set of data, wherein the set of data includes a subset of meta-bits, the set of data is received as a plurality of transfers, and the memory system includes a first rank and a second rank the first rank and the second rank being included in a common dual in-line memory module (DIMM), wherein the first rank and the second rank each include ten arrays, the plurality of transfers including a first transfer; and additional transfers, and the subset of meta-bits are received with the first transfer, and the first transfer is received prior to the additional transfers of the plurality of transfers, where the additional transfers do not include the subset of meta-bits, wherein each array receives one meta-bit from the subset of meta-bits during the first transfer;
decoding, by a decoder, the subset of meta-bits, wherein the subset of meta-bits are configured to indicate the set of data is important; and
storing, based on the decoding, the set of data in a persistent storage medium.

2. The method of claim 1, wherein the first rank includes a volatile storage medium and the second rank includes the persistent storage medium, the method further comprising:
storing the set of data in the first rank.

3. The method of claim 2, wherein the volatile storage medium is dynamic random access memory, and the persistent storage medium is magnetic random access memory.

4. The method of claim 2, wherein the first rank has a greater capacity than the second rank.

5. The method of claim 1, wherein the DIMM can support a double data rate configuration.

6. The method of claim 5, wherein the double data rate configuration is a double data rate.

7. The method of claim 1, wherein the DIMM is an unregistered DIMM.

8. The method of claim 1, wherein the DIMM is a registered DIMM.

9. The method of claim 1, wherein the subset of meta-bits is a first subset of meta-bits, and the set of data includes a second subset of meta-bits, wherein the second subset of meta-bits are configured to provide an additional instruction.

10. A system comprising:
a processor;
a memory system, wherein the memory system includes a first rank, a second rank, and a decoder; and
a computer-readable storage medium communicatively coupled to the processor and storing program instructions which, when executed by the processor, are configured to cause the processor to:
receive, by a memory system, a set of data, wherein the set of data includes a subset of meta-bits, the set of data is received as a plurality of transfers, and the memory system includes a first rank and a second rank the first rank and the second rank being included in a common dual in-line memory module (DIMM), wherein the first rank and the second rank each include ten arrays, the plurality of transfers including a first transfer; and additional transfers; and the subset of meta-bits are received with the first transfer, and the first transfer is received prior to the additional transfers of the plurality of transfers, where the additional transfers do not include the subset of meta-bits, wherein each array receives one meta-bit from the subset of meta-bits during the first transfer;
decode, by the decoder, the subset of meta-bits, wherein the subset of meta-bits are configured to indicate the set of data is important; and
store, based on the decoding, the set of data in a persistent storage medium.

11. The system of claim 10, wherein the program instructions are further configured to cause the processor to:
store the set of data in the first rank, wherein the first rank includes a volatile storage medium and the second rank includes the persistent storage medium.

12. The system of claim 11, wherein the volatile storage medium is dynamic random access memory, and the persistent storage medium is magnetic random access memory.

13. A computer program product, the computer program product comprising a computer readable storage medium having program instructions embodied therewith, the program instructions executable by a processing unit to cause the processing unit to:
receive, by a memory system, a set of data, wherein the set of data includes a subset of meta-bits, the set of data is received as a plurality of transfers, and the memory system includes a first rank and a second rank the first rank and the second rank being included in a common dual in-line memory module (DIMM), wherein the first rank and the second rank each include ten arrays, the plurality of transfers including a first transfer; and additional transfers, and the subset of meta-bits are received with the first transfer, and the first transfer is received prior to the additional transfers of the plurality of transfers, where the additional transfers do not include the subset of meta-bits, wherein each array receives one meta-bit from the subset of meta-bits during the first transfer;
decode, by a decoder, the subset of meta-bits, wherein the subset of meta-bits are configured to indicate the set of data is important; and
store, based on the decoding, the set of data in a persistent storage medium.

14. The computer program product of claim 13, wherein the program instructions are further configured to cause the processing unit to:
store the set of data in the first rank, wherein the first rank includes a volatile storage medium and the second rank includes the persistent storage medium.

15. The computer program product of claim 14, wherein the volatile storage medium is dynamic random access memory, and the persistent storage medium is magnetic random access memory.

16. The method of claim 1, wherein the plurality of transfers consists of 8 transfers and the set of data consists of 512 bits of data, 112 bits of error correction code, 10 bits of meta-bits and 6 other bits.

17. The method of claim 1, wherein the plurality of transfers includes 16 transfers, and the set of data consists of 1024 bits of data, 224 bits of error correction code, 16 bits of meta-bits and 6 other bits.

* * * * *